US012495484B2

(12) United States Patent
Li et al.

(10) Patent No.: US 12,495,484 B2
(45) Date of Patent: Dec. 9, 2025

(54) PRINTED CIRCUIT BOARD, BACKPLANE ARCHITECTURE SYSTEM, AND COMMUNICATION DEVICE

(71) Applicant: Huawei Technologies Co., Ltd., Shenzhen (CN)

(72) Inventors: Wenliang Li, Shenzhen (CN); Yongwei Chen, Shenzhen (CN); Xusheng Liu, Shenzhen (CN); Zhong Yan, Dongguan (CN); Zewen Wang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 264 days.

(21) Appl. No.: 18/308,267

(22) Filed: Apr. 27, 2023

(65) Prior Publication Data

US 2023/0269862 A1    Aug. 24, 2023

Related U.S. Application Data

(63) Continuation of application No. PCT/CN2021/127092, filed on Oct. 28, 2021.

(30) Foreign Application Priority Data

Oct. 29, 2020    (CN) .......................... 202011180015.2

(51) Int. Cl.
*H05K 1/02*    (2006.01)
*H05K 1/11*    (2006.01)

(52) U.S. Cl.
CPC .......... *H05K 1/0225* (2013.01); *H05K 1/116* (2013.01); *H05K 2201/096* (2013.01); *H05K 2201/09609* (2013.01)

(58) Field of Classification Search
None
See application file for complete search history.

(56) References Cited

U.S. PATENT DOCUMENTS 7,239,526 B1 * 7/2007 Bibee ................... H05K 1/0219
361/795
10,559,929 B2    2/2020 Pickel et al.
(Continued)

FOREIGN PATENT DOCUMENTS

CN    101945537 A    1/2011
CN    203015284 U    6/2013
(Continued)

OTHER PUBLICATIONS

JP-2012035359-A Translation (Year: 2025).*
FR-2834384-A1 Translation (Year: 2025).*

*Primary Examiner* — Timothy J Thompson
*Assistant Examiner* — John B Freal
(74) *Attorney, Agent, or Firm* — Conley Rose, P.C.

(57) ABSTRACT

A printed circuit board includes a plurality of layer structures disposed in a stacked manner, and the printed circuit board has a disposing face. A differential pair unit and a shielding structure for shielding the differential pair unit are disposed on the disposing face. The differential pair unit includes two signal via holes, each signal via hole passes through the plurality of layer structures, and an anti-pad corresponding to each signal via hole is disposed on a ground layer through which the signal via hole passes. A part of metal of a ground layer is spaced between two anti-pads. Each signal corresponds to one anti-pad, and a ground layer is spaced between anti-pads.

20 Claims, 7 Drawing Sheets

(56) References Cited

U.S. PATENT DOCUMENTS

| | | | |
|---|---|---|---|
| 2011/0005814 A1 | 1/2011 | Liu et al. | |
| 2014/0209370 A1 * | 7/2014 | Minich | G09B 23/183 174/266 |
| 2016/0150633 A1 | 5/2016 | Cartier, Jr. | |
| 2016/0150645 A1 * | 5/2016 | Gailus | H05K 1/0219 174/262 |
| 2017/0265296 A1 | 9/2017 | Carbonneau et al. | |
| 2022/0192007 A1 | 6/2022 | Li et al. | |

FOREIGN PATENT DOCUMENTS

| | | | | |
|---|---|---|---|---|
| CN | 104969669 A | | 10/2015 | |
| CN | 107408786 A | | 11/2017 | |
| CN | 107535044 A | | 1/2018 | |
| CN | 207201069 U | | 4/2018 | |
| CN | 109076700 A | | 12/2018 | |
| CN | 110087383 A | | 8/2019 | |
| CN | 110730558 A | | 1/2020 | |
| FR | 2834384 A1 | * | 7/2003 | ........... G02B 6/4201 |
| JP | 2001127439 A | | 5/2001 | |
| JP | 2012035359 A | * | 2/2012 | ............. B23B 51/02 |

\* cited by examiner

PRINTED CIRCUIT BOARD, BACKPLANE ARCHITECTURE SYSTEM, AND COMMUNICATION DEVICE

CROSS-REFERENCE TO RELATED APPLICATIONS

This is a continuation of International Patent Application No. PCT/CN2021/127092 filed on Oct. 28, 2021, which claims priority to Chinese Patent Application No. 202011180015.2 filed on Oct. 29, 2020. The disclosures of the aforementioned applications are hereby incorporated by reference in their entireties.

TECHNICAL FIELD

This application relates to the field of communication technologies, and in particular, to a printed circuit board, a backplane architecture system, and a communication device.

BACKGROUND

In a current electronic device, a printed circuit board is usually used as a carrier of electronic components, and the components are interconnected through a trace of the printed circuit board. The components form stable electrical connections and mechanical connections with the printed circuit board through press-fitting and welding.

When a component has a plurality of signals that need to be connected to a printed circuit board, the printed circuit board needs to have enough pads or via holes connected to a plurality of pins corresponding to the plurality of signals. A typical scenario is that a solder ball pin of a chip with a ball grid array (BGA) package form is connected to an arrayed pad on the printed circuit board, and a pressfit fisheye pin of a high-speed connector is connected to an arrayed via hole on the printed circuit board.

For multi-pin package of the plurality of signals, to reduce an area of the chip on the board and an area of the connector on the board as much as possible, a spacing between pin pads is very small. For a chip pad, a minimum spacing can be about 0.4 millimeters (mm); and for a pressfit pin pad of the connector, a minimum spacing can be about 1.1 mm. In both a chip scenario and a connector scenario, for these signals, a fanout of a trace needs to be performed within a limited package area. In this case, a large quantity of via holes need to be used to connect the component to traces at each layer on the board. A large quantity of signal via holes and traces in a high-density package region are adjacent to each other, which causes a crosstalk problem.

SUMMARY

This application provides a printed circuit board, a backplane architecture system, and a communication device to resolve a crosstalk problem of the backplane architecture system, and improve signal transmission effect.

According to a first aspect, a printed circuit board is provided. The printed circuit board is applied to a backplane architecture system, the printed circuit board includes a plurality of layer structures disposed in a stacked manner, and the plurality of layer structures are different functional layers. For example, the plurality of layer structures include ground layers and conductor layers that are alternately arranged. In addition, to cooperate with another device, a disposing face that cooperates with the other device is disposed on the printed circuit board, and the disposing face is a surface of a layer structure located at an outermost layer in the plurality of layer structures. A differential pair unit and a shielding structure for shielding the differential pair unit are disposed on the disposing face. The differential pair unit includes two signal via holes, and each signal via hole passes through at least some of the ground layers and the conductor layers, and is connected to a trace at one of the conductor layers. In addition, an anti-pad corresponding to each signal via hole is disposed on a ground layer through which the signal via hole passes, to prevent the signal via hole from being grounded. When two anti-pads are disposed, anti-pads corresponding to the two signal via holes are arranged at intervals, and a part of metal of a ground layer is spaced between the two anti-pads. The shielding structure includes two primary ground holes and a first secondary ground hole that are disposed on the disposing face, the two primary ground holes are located on two sides of the differential pair unit, and the first secondary ground hole is located between the two signal via holes. The primary ground holes and the first secondary ground hole separately pass through some of the conductor layers and the ground layers, and the primary ground holes and the first secondary ground hole are separately grounded to a ground layer through which the primary ground holes and the first secondary ground hole pass. In the foregoing technical solution, each signal corresponds to one anti-pad, and a ground layer is spaced between anti-pads, thereby reducing interference, to a trace, of a signal of a signal via hole or a trace of an adjacent layer after passing through an anti-pad, and resolving a crosstalk problem in the printed circuit board. In addition, the primary ground holes and the first secondary ground hole form the shielding structure to reduce crosstalk between a differential pair unit and another differential pair unit, and resolve a crosstalk problem of the printed circuit board, thereby facilitating dense arrangement of sockets on the printed circuit board.

In a specific implementable solution, a trace of conductor layers on two sides of a first ground layer is located outside of anti-pads of the first ground layer, and the first ground layer is a ground layer through which each signal via hole passes. By interconnecting parts of the ground layer in the middle of the anti-pad and adjacent primary ground via holes and secondary ground via holes, mutual coupling interference between traces of conductor layers on two sides is minimized, and effect of the printed circuit board is improved.

In a specific implementable solution, the anti-pad is in different shapes such as a circle, a square, or an oval such that different anti-pads are used to improve crosstalk between traces.

In a specific implementable solution, the anti-pad is in a shape of a circle, and the anti-pad and a corresponding signal via hole are coaxial, thereby further reducing an area of the anti-pad, improving crosstalk between a signal via hole and a trace, and also improving crosstalk between traces.

In a specific implementable solution, there are a plurality of differential pair units, and adjacent differential pair units share a primary ground hole. A quantity of primary ground holes is reduced.

In a specific implementable solution, a width of each primary ground hole in a first direction is greater than a width of each signal via hole in the first direction; and the first direction is a direction parallel to the disposing face and perpendicular to an arrangement direction of the two signal via holes. Shielding effect on a signal via hole is improved.

In a specific implementable solution, each primary ground hole includes a primary hole and at least one secondary hole that surrounds the primary hole, and the primary hole communicates with and is electrically connected to each secondary hole. The shielding effect on the signal via hole is improved through cooperation between a primary hole and a secondary hole.

In a specific implementable solution, each primary ground hole includes two primary holes and a secondary hole located between the two primary holes, and the secondary hole separately communicates with and is electrically connected to the two primary holes. The shielding effect on the signal via hole is improved through cooperation between a primary hole and a secondary hole.

In a specific implementable solution, the primary hole may be a via hole in different shapes such as a circle, a square, or an oval. The secondary hole may be a via hole in different shapes such as a circle, a square, or an oval.

In a specific implementable solution, the two primary ground holes and the first secondary ground hole form a C-shaped shielding structure that wraps the differential pair unit. The primary ground holes and the first secondary ground hole form a C-shaped shape to wrap the differential pair unit, to improve shielding effect on the differential pair unit.

In a specific implementable solution, when the primary ground hole includes the primary hole and the at least one secondary hole that surrounds the primary hole, a center point connection line of the two primary ground holes overlaps a center point connection line of the two signal via holes. This facilitates arrangement of the primary ground hole.

In a specific implementable solution, a center point of the first secondary ground hole is located on one side of the center point connection line of the two signal via holes. This facilitates forming of a C-shaped shielding structure.

In a specific implementable solution, there are two first secondary ground holes, and center points of the two first secondary ground holes are respectively located on two sides of the center point connection line of the two signal via holes. In this way, shielding effect on the differential pair unit is improved.

In a specific implementable solution, the shielding structure further includes a second secondary ground hole disposed between the primary ground hole and an adjacent signal via hole. Shielding effect of the formed shielding structure on the differential pair unit is further improved.

According to a second aspect, a backplane architecture system is provided. The backplane architecture system includes a backplane and a connector connected to the backplane, and the backplane is the printed circuit board according to any one of the foregoing specific implementable solutions. In the foregoing technical solution, each signal corresponds to one anti-pad, and a ground layer is spaced between anti-pads, thereby reducing interference, to a trace, of a signal of a signal via hole or a trace of an adjacent layer after passing through an anti-pad, and resolving a crosstalk problem in the printed circuit board. In addition, primary ground holes and a first secondary ground hole form a shielding structure, to reduce crosstalk between a differential pair unit and another differential pair unit, and resolve a crosstalk problem of the printed circuit board, thereby facilitating dense arrangement of sockets on the printed circuit board.

According to a third aspect, a communication device is provided. The communication device includes a cabinet and the printed circuit board according to any one of the foregoing specific implementable solutions, and the printed circuit board is inserted into the cabinet. In the foregoing technical solution, each signal corresponds to one anti-pad, and a ground layer is spaced between anti-pads, thereby reducing interference, to a trace, of a signal of a signal via hole or a trace of an adjacent layer after passing through an anti-pad, and resolving a crosstalk problem in the printed circuit board. In addition, primary ground holes and a first secondary ground hole form a shielding structure, to reduce crosstalk between a differential pair unit and another differential pair unit, and resolve a crosstalk problem of the printed circuit board, thereby facilitating dense arrangement of sockets on the printed circuit board.

DESCRIPTION OF EMBODIMENTS

The following further describes embodiments of this application in detail with reference to the accompanying drawings.

First, several concepts described in embodiments of this application are described.

Crosstalk: Crosstalk means coupling effect occurring when aggressor signals are transmitted from one network to another network.

Anti-pad: In a connector package region, all layer structures of a printed circuit board except a signal trace layout layer are usually a power layer and a ground layer. These plane layers are actually metal layers. To bypass via holes in a vertical direction, via hole pads, package pads at all layers, and the like, the metal plane layers (the power layer and the ground layer) need to be hollowed out to avoid short circuits caused by contact of different networks. A region that is hollowed out at these metal layers is referred to as an anti-pad.

Ground hole: A ground hole indicates a via hole through which a signal return current passes, and is a reference of a signal via hole (the current forms a closed loop).

Signal via hole: A signal via hole is a via hole through which a data signal passes.

Package: A package in this embodiment of this application indicates an arrangement manner of a pad and a via hole that are used to match a pin corresponding to a component such as a chip or a connector on a printed circuit board.

Differential signal: A single-end signal needs to be transmitted between a transmitter and a receiver through a wire. Different from the single-end signal, differential signals need to be transmitted through two wires. The signals on the two wires are of the same size and have opposite polarities. A signal sampled by the receiver is half of a difference between the signals on the two wires. A pair of traces or via holes that form a differential signal transmission path is referred to as a differential pair.

SerDes: SerDes is short for serializer/deserializer. To be specific, a plurality of low-speed parallel signals are converted into high-speed serial signals at a transmit end, and after passing through a transmission medium, the high-speed serial signals are converted into low-speed parallel signals at a receive end.

For ease of understanding of the printed circuit board provided in embodiments of this application, an application scenario of the printed circuit board provided in embodiments of this application is first described, and the printed circuit board provided in embodiments of this application is applied to a device in a communication system.

Figure 1:
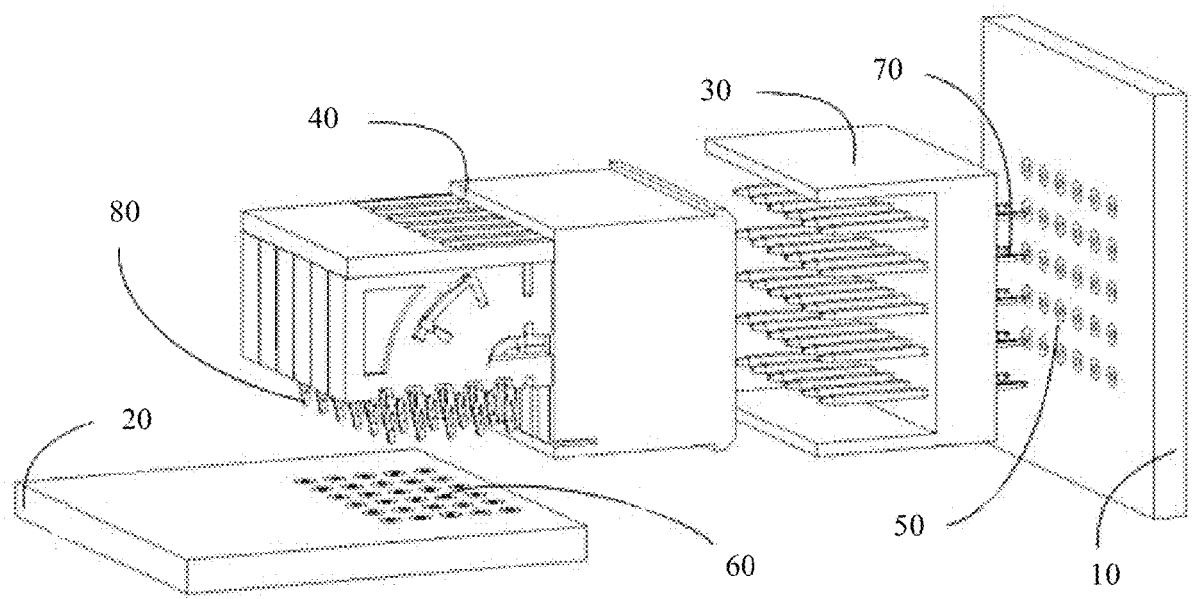
FIG. 1 is a schematic exploded view of a backplane architecture system.

FIG. 1 is a schematic exploded view of a backplane architecture system. The backplane architecture system includes a backplane 10, a male connector 30, a female connector 40, and a board 20. The backplane 10 is provided with a package 50 corresponding to the male connector 30, where the package 50 is a part of the backplane 10, and is a region formed by a group of regularly arranged via holes and corresponding anti-pads. In system implementation, some via holes in the package 50 accommodate a pressfit pin 70 of the connector 30 such that the connector 30 is installed and fastened onto the backplane 10, and an electrical connection is provided. The board 20 is provided with a package 60 corresponding to the female connector 40, where the package 60 is a part of the board 20, and the package 60 is a region formed by a group of regularly arranged via holes and corresponding anti-pads. In system implementation, some via holes in the package 60 accommodate a pressfit pin 80 of the connector 40 such that the connector 40 is installed and fastened onto the board 20, and an electrical interconnection is provided. The printed circuit board provided in this embodiment of the present disclosure may be a board in a backplane architecture system, or may be a backplane.

Figure 2:
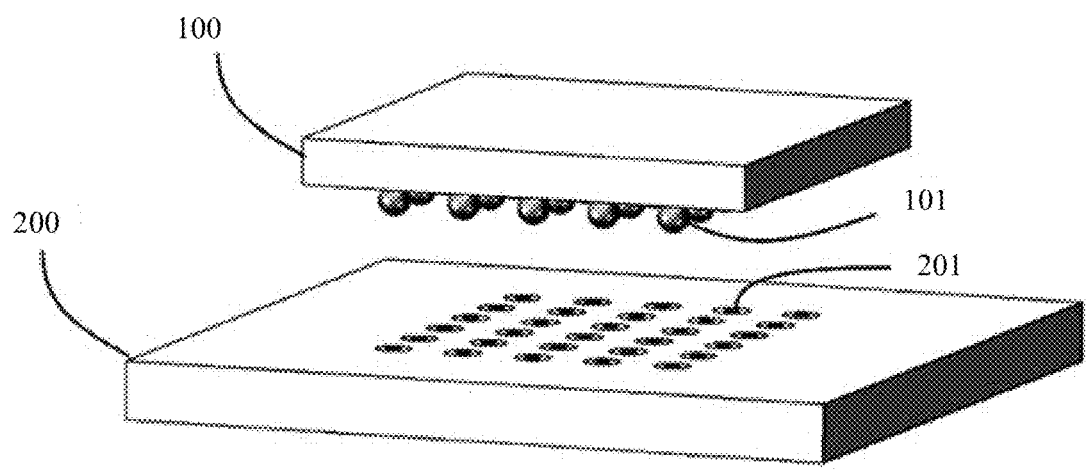
FIG. 2 is a schematic diagram of a scenario in which a chip is connected to a printed circuit board.

FIG. 2 is a schematic diagram of a scenario in which a chip 100 is connected to a printed circuit board 200. The chip 100 has a solder ball pin 101, and package 201 corresponding to the solder ball pin 101 of the chip is disposed on the printed circuit board 200. The package 201 is further a combination of a surface pad corresponding to the solder ball pin in the package of the chip, a via hole and an internal layer trace that are correspondingly connected to the surface pad to implement a fanout of a trace after layer switching in a neighboring region, and an anti-pad. In system implementation, some surface pads in the package 201 are connected to solder ball pins 101 of the chip 100 such that the chip 100 is installed and fastened onto the printed circuit board 200, and an electrical interconnection is provided.

In the application scenarios of the printed circuit board shown in FIG. 1 and FIG. 2, when a signal data rate is increased to 90 gigabits per sec+(Gbps+), pulse-amplitude modulation 4-level (PAM4) is mostly used for a signal, and aPAM4, as a hot signal transmission technology for high-speed signal interconnection in a next-generation data center is widely used for level modulation of electrical signal or optical signal transmission of a 200 G/400 gigahertz (G) interface, to ensure a rate increase and also reduce a challenge to an interconnection bandwidth or even costs. However, a signal voltage step of PAM4 encoding is ⅓ of an NRZ (non-return-to-zero) signal, but results in a signal-to-noise ratio loss of 9.5 decibels (dB). Therefore, when data is transmitted through PAM4 encoding, a requirement on noise performance is stricter. Even if NRZ level modulation is still used, a bandwidth increase caused by a rate increase still requires that noise is constrained within a higher bandwidth. Crosstalk, as one of passive indicators of high-speed signal integrity, is more difficult to optimize in a case of a higher rate. In addition, because a crosstalk suppression capability on a SerDes active circuit is also very limited, crosstalk optimization is usually a top priority in a high-speed design. However, in the conventional technology, when a printed circuit board is connected to a chip or a connector, in a high-density package region of components, transferring on a signal transmission path is performed through a signal via hole and a fanout of a trace at each layer inside the printed circuit board, and in this dense space, a via hole in a vertical direction and a trace in a plane direction both generate coupling interference with each other. Therefore, embodiments of this application provide a printed circuit board, to improve crosstalk between via holes or crosstalk between via holes and traces when the printed circuit board is used.

Figure 3:
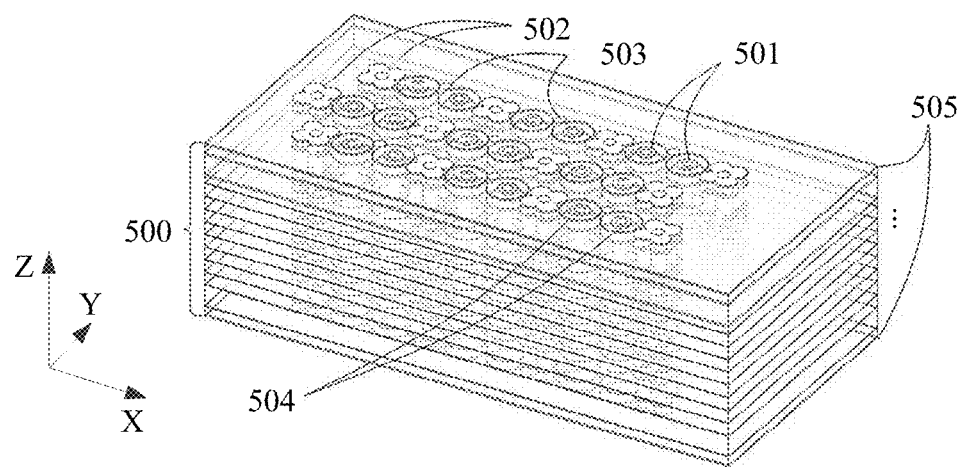
FIG. 3 is a schematic diagram of a structure of a printed circuit board according to an embodiment of this application.

FIG. 3 is a schematic diagram of a structure of a printed circuit board according to an embodiment of this application. For ease of understanding a relative position relationship between structures on the printed circuit board provided in this embodiment of this application, a reference coordinate system XYZ is established, where an X direction, a Y direction, and a Z direction are perpendicular to each other. Three adjacent side edges of the printed circuit board are respectively parallel to the X direction, the Y direction, and the Z direction in a one-to-one correspondence manner. In addition, a disposing face of the printed circuit board is defined, and the disposing face is parallel to an XY plane. The disposing face is configured to be correspondingly connected to another component. For example, in the backplane architecture system shown in FIG. 1, the disposing face is a surface on which a board or a backplane cooperates with a connector; and in the chip shown in FIG. 2, the disposing face is a surface on which a printed circuit board cooperates with a chip.

The printed circuit board 500 provided in this embodiment of this application has a plurality of layer structures, and the plurality of layer structures are arranged in a stackup or a stacked manner along a Z direction. The plurality of layer structures may be layer structures having different functions. For example, the plurality of layer structures include conductor layers and ground layers 505. The conductor layer is an internal trace layout layer of the printed circuit board 500, and the conductor layer is configured to arrange a trace to transfer a signal. The ground layer 505 is used as a reference ground layer of the printed circuit board 500, and is configured to implement grounding effect. The ground layer 505 is used as a reference ground layer for laying out traces in the layer structures of the printed circuit board 500 that are disposed in the stackup or the stacked manner, and the ground layer 505 provides a plane return path of a signal.

The disposing face of the printed circuit board 500 is a surface located at an outermost layer in the plurality of layer structures. For example, when the outermost layer is the ground layer 505, the disposing face is an exposed surface of the ground layer 505; or when the outermost layer is the conductor layer, the disposing face is an exposed surface of the conductor layer.

To implement an electrical connection between the printed circuit board 500 and another component (such as a chip or a connector), a differential pair unit is disposed on the disposing face of the printed circuit board 500, where the differential pair unit includes two signal via holes 501 for transmitting differential signals. For example, when the two signal via holes 501 cooperate with the connector, two pressfit pins that are paired are disposed on the connector, and the two signal via holes 501 are inserted into or removed from the two pressfit pins in a one-to-one correspondence manner, to transmit paired signals.

An opening of each signal via hole 501 of the differential pair unit is located on the disposing face, and each signal via hole 501 extends to an internal layer of the printed circuit board 500 along the Z direction. When extending along the Z direction, the signal via hole 501 passes through at least some of the ground layers 505 and the conductor layers, and is connected to a trace at one of the conductor layers. For example, two signal via holes 501 are respectively connected to two traces at a same conductor layer in a one-to-one correspondence manner. The signal via hole 501 and the trace are used to implement transition from being along a vertical direction of the signal via hole to being along a trace plane direction of the printed circuit board 500.

An inner side wall of the signal via hole 501 is metalized to have conductivity. When the printed circuit board 500 cooperates with the connector, the signal via hole 501 needs to accommodate a pressfit pin of the connector, to complete reliable electrical interconnection between the printed circuit board 500 and the connector, and is responsible for vertical (in the Z direction) signal transfer, to implement a signal transfer of the connector to a transfer of an internal layer trace of the printed circuit board 500. When the printed circuit board 500 cooperates with the chip, the signal via hole 501 is responsible for interconnecting a chip pad with the internal layer trace of the printed circuit board 500, to implement vertical signal transfer and layer switching. It should be understood that, when the signal via hole 501 is disposed, a depth of the signal via hole 501 is usually less than or equal to a thickness of the printed circuit board 500, and is greater than a depth of a layer at which the conductor layer correspondingly connected to the signal via hole 501 is located. When the signal via holes 501 pass through the ground layers 505, an anti-pad 504 (not shown in the figure) corresponding to each signal via hole 501 is disposed on a ground layer 505 through which the signal via hole 501 passes, to prevent the signal via hole 501 from being grounded.

Figure 4:
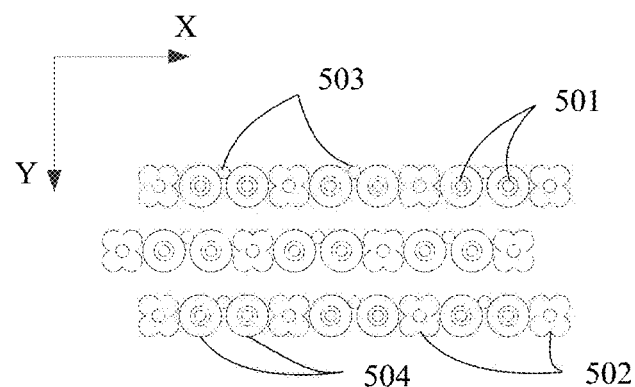
FIG. 4 is a schematic diagram of a disposing face of a printed circuit board.

FIG. 4 is a schematic diagram of a disposing face of a printed circuit board. For a plurality of differential pair units, usually, to reduce an area of the chip on the board and an area of the connector on the board as much as possible and consider another system specification, a spacing between signal via holes 501 disposed on the printed circuit board is very small. For a signal via hole 501 corresponding to the chip, a minimum spacing can be about 0.4 mm; and for a signal via hole 501 corresponding to the connector, a minimum spacing can be about 1.1 mm.

As shown in FIG. 4, signal via holes 501 are arranged in an array along the X direction and the Y direction. When the signal via holes 501 are arranged, a large quantity of signal via holes 501 are adjacent to each other, which may cause a crosstalk problem. To resolve the crosstalk problem between the signal via holes 501, a shielding structure for shielding the differential pair units is disposed on the disposing face of the printed circuit board provided in this embodiment of this application. The shielding structure is configured to isolate adjacent differential pair units to avoid crosstalk. For ease of description, in the following, a differential pair unit that may cause interference is named as an interfering pair, and a differential pair unit that may be interfered with is named as an interfered pair.

The shielding structure includes two primary ground holes 502 and a first secondary ground hole 503 that are on the disposing face, the two primary ground holes 502 are located on two sides of the differential pair unit, and the first secondary ground hole 503 is located between the two signal via holes 501. As shown in FIG. 4, primary ground holes 502 corresponding to each differential pair unit and two signal via holes 501 of the differential pair unit are arranged in a row (along the X direction). When the primary ground holes 502 are disposed, along an arrangement direction of the two signal via holes 501, the primary ground holes 502 are separately arranged on two sides of the differential pair unit. The first secondary ground hole 503 is disposed between the two signal via holes 501. On the disposing face, the two primary ground holes 502 and the first secondary ground hole 503 form a "C"-shaped shielding structure that wraps the two signal via holes 501. The following describes the shielding structure in detail with reference to the accompanying drawings.

With reference to the layer structures shown in FIG. 3, the primary ground holes 502 and the first secondary ground hole 503 separately pass through some of the conductor layers and the ground layers 505, and the primary ground holes 502 and the first secondary ground hole 503 are separately grounded to a ground layer 505 through which the primary ground holes and the first secondary ground hole pass. When the signal via hole 501 passes through the ground layer 505, an anti-pad 504 corresponding to each signal via hole is disposed on the ground layer 505.

When there are a plurality of differential pair units, adjacent differential pair units share a primary ground hole 502. To be specific, in differential pair units in the same row, only one primary ground hole 502 needs to be disposed between two adjacent differential pair units, and the primary ground hole 502 is in a shielding structure of the two adjacent differential pair units. In this way, a quantity of disposed primary ground holes 502 is reduced.

Figure 5:
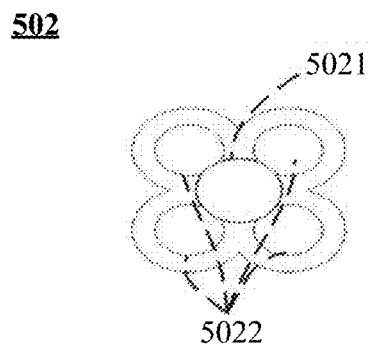
FIG. 5 is a schematic diagram of a structure of a primary ground hole according to an embodiment of this application.

Also, refer to FIG. 5. FIG. 5 is a schematic diagram of a structure of a primary ground hole 502. Each primary ground hole 502 is a primary-secondary ground hole, and along the Z direction, the primary-secondary ground hole passes through each layer structure of the printed circuit board, and connects each ground layer through which the primary ground hole 502 passes in the printed circuit board. During signal transmission, a signal is transferred in the printed circuit board through a signal via hole and a trace connected to the signal via hole. The primary ground hole 502 is configured to transfer a return current of the signal, and is an important component of a signal propagation path.

The primary-secondary ground via hole is a combination of several connected ground via holes on the printed circuit board, each primary-secondary ground hole includes at least one primary hole 5021 and at least one secondary hole 5022, and the primary hole 5021 communicates with and is electrically connected to each secondary hole 5022. In an application scenario of the chip, the primary hole 5021 of the primary-secondary ground hole accommodates a ground pin of the connector, to complete reliable electrical interconnection between the printed circuit board and the connector, and also connect a ground layer through which the primary hole 5021 passes in the printed circuit board. The secondary hole 5022 of the primary-secondary ground hole does not need to accommodate a ground pin. Therefore, a smaller hole diameter may be usually used, to be specific, a diameter of the secondary hole 5022 is less than a diameter of the primary hole 5021. The secondary hole 5022 needs to be physically connected to the primary hole 5021, and connects a ground layer through which the secondary hole 5022 passes in the printed circuit board. In an application scenario of the chip, a primary-secondary ground hole is responsible for interconnecting a ground pad of the chip with a ground reference layer in the printed circuit board. A hole connected to the ground pad is a primary hole 5021, and a hole distributed around by using the primary hole as a center is a secondary hole 5022. The primary hole 5021 and the secondary hole 5022 connect a ground layer through which the primary hole 5021 and the secondary hole 5022 pass in the printed circuit board. It should be understood that, regardless of the foregoing application scenarios, a depth of the primary-secondary ground hole is not less than a depth of a signal via hole.

For example, as shown in FIG. 5, the primary ground hole 502 includes at least one primary hole 5021 and four secondary holes 5022 near the primary hole 5021, and the four secondary holes 5022 are disposed around the primary hole 5021, which are arranged in a "quincunx"-shaped structure. A part of a side wall of the primary hole 5021 is a part of a side wall of the secondary hole 5022. In specific implementation, first, a hole is drilled in the printed circuit board along the Z direction to form several secondary holes 5022 and copper is plated, and then the hole is plugged by using a material such as resin, and then a hole is drilled in a central position between the several secondary holes 5022 and electroplating is performed to form the primary hole 5021.

In an optional solution, the primary hole 5021 may be a via hole in different shapes such as a circle, a square, or an oval. Similarly, the secondary hole 5022 may be a via hole in different shapes such as a circle, a square, or an oval. When the primary hole 5021 and the secondary hole 5022 are specifically disposed, holes in any shape may be used for combination.

Still refer to FIG. 4. The first secondary ground hole 503 is a secondary hole with a small diameter in the printed circuit board, and is usually a via hole with a minimum hole diameter that can be implemented in the printed circuit board under a limit condition of a thickness-diameter ratio (which is a board thickness/a hole diameter, to be specific, a ratio of a thickness of the printed circuit board to a hole diameter). The first secondary ground hole 503 is not directly connected to a pin of a connector or a chip, but interconnects a ground layer in layers through which the first secondary ground hole 503 passes in the printed circuit board. During use, the first secondary ground hole 503 cooperates with the primary ground hole 502 to form a shielding structure together that shields the differential pair unit, which helps improve crosstalk in a package region. In an optional solution, a quantity of first secondary ground holes 503 is not limited to one, and may be alternatively two. When there are two first secondary ground holes, and center points of the two first secondary ground holes are respectively located on two sides of a center point connection line of the two signal via holes, to form an "O"-shaped shielding structure, thereby improving shielding effect on the differential pair unit.

Figure 6:
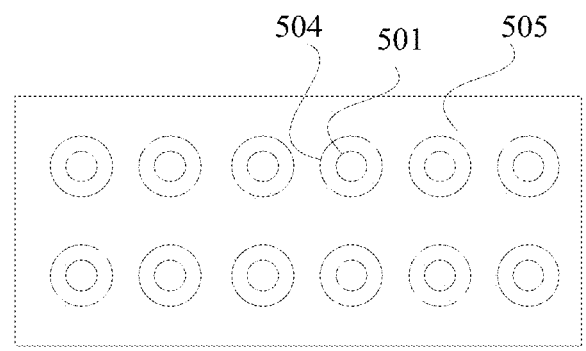
FIG. 6 shows a manner of disposing an anti-pad of a ground layer according to an embodiment of this application.

FIG. 6 shows a manner of disposing an anti-pad 504 of a ground layer 505. The anti-pad 504 is a hollowed-out region that is disposed on the ground layer 505 through which a signal via hole 501 passes and that corresponds to the signal via hole 501, to avoid electricity conduction between the signal via hole 501 and the ground layer 505. For each differential pair unit, two signal via holes 501 included in the differential pair unit each correspond to one anti-pad 504. The anti-pads 504 corresponding to the two signal via holes 501 are arranged at intervals, and a part of metal of a ground layer 505 is spaced between the two anti-pads 504. The anti-pad 504 is a hollowed-out region of a metal layer that is designed to bypass the signal via hole 501 in the ground layer 505 of the printed circuit board. An anti-pad 504 needs to be designed for any ground layer 505 through which a signal via hole 501 passes. In this embodiment of this application, the anti-pad 504 is designed in a form of a double anti-pad 504, to be specific, one signal via hole 501 in each differential pair unit corresponds to one anti-pad 504.

In an optional solution, the anti-pad 504 is in different shapes such as a circle, a square, or an oval, provided that galvanic isolation between the signal via hole 501 and the ground layer 505 is implemented. As an optional solution, the anti-pad 504 is in a shape of a circle, and the anti-pad 504 and a corresponding signal via hole 501 are coaxial such that a size of the anti-pad 504 can be reduced.

In this embodiment of this application, for crosstalk in the printed circuit board, the printed circuit board provided in this embodiment of this application is designed in a ground hole array (of a primary ground hole and a first secondary ground hole) in a vertical direction, and is combined with a double anti-pad 504 to construct a small-sized grid in three-dimensional space in a package region, thereby constraining electromagnetic field propagation interference to a maximum extent and implementing low crosstalk performance. The following describes in detail how structures in the printed circuit board in embodiments of this application shield a signal.

Crosstalk in a package region of the printed circuit board may be divided into hole-hole coupling (coupling between signal via holes 501 in a differential pair unit and another differential pair unit) crosstalk, hole-trace coupling (coupling between a signal via hole 501 and a trace) crosstalk, and trace-trace coupling (coupling between a trace and another trace) crosstalk. Because a main body of the package region is determined by a signal via hole 501 and a ground hole, the hole-hole coupling crosstalk is usually a primary consideration object. The hole-hole coupling may be divided into electric field coupling and magnetic field coupling in terms of electromagnetic coupling principle. The electric field coupling is usually obvious when two signal via holes 501 are close to each other. For example, in signal via holes 501 in the same row, interference caused by the electric field coupling between adjacent signal via holes 501 of different differential pair units is positively correlated with mutual capacitance between the signal via holes 501. The magnetic field coupling is common, and interference caused by the magnetic field coupling is positively correlated with mutual inductance between the signal via holes 501.

From a source of interference, the electric field coupling needs to be suppressed by reducing mutual capacitance. A main manner thereof is to reduce an area of overlap of an attack hole (a signal via hole 501 that generates a crosstalk signal) and a victim hole (a signal via hole 501 subject to crosstalk) or extend a distance between the attack hole and the victim hole. The magnetic field coupling needs to be suppressed by reducing mutual inductance. A main method is to improve backflow of a signal via hole 501 by disposing a nearest reference ground hole, preventing a return current from crossing and being divided, and constraining distribution of an electromagnetic field.

Figure 7:
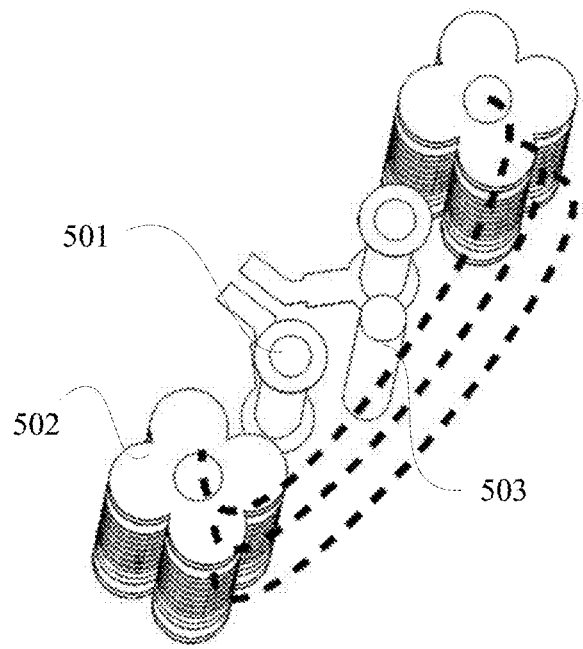
FIG. 7 shows a shielding structure formed by a primary ground hole and a secondary ground hole according to an embodiment of this application.

On the basis of the foregoing working principle, as shown in FIG. 7, the printed circuit board provided in this embodiment of this application constructs a "C"-shaped ground hole array (of a primary ground hole 502 and a first secondary ground hole 503) to isolate signal via holes 501 in different differential pair units and reduce an area of overlap of the signal via holes 501, to reduce electric field coupling. In addition, a ground hole array is used to improve backflow of a signal via hole 501, and an electromagnetic field of the signal via hole 501 in each differential pair unit is constrained in the "C"-shaped ground hole array, to reduce magnetic field coupling, and finally suppress hole-hole coupling.

Figure 8:
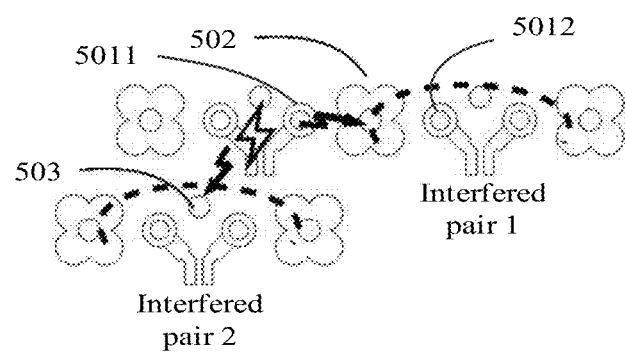
FIG. 8 is a schematic diagram of crosstalk between different differential pair units according to an embodiment of this application.

FIG. 8 shows an example of a crosstalk condition between different differential pair units. For ease of description, the differential pair units are divided into an interfering pair and an interfered pair based on the crosstalk condition. The interfering pair means a differential pair unit that sends a signal interfering with another differential pair unit, and the interfered pair means a differential pair unit that is interfered with by a signal of another differential pair unit.

For an interfering pair and an interfered pair 1 in the same row, one signal via hole in the interfering pair and one signal via hole in the interfered pair 1, for example, a first signal via hole 5011 in the interfering pair and a second signal via hole 5012 in the interfered pair 1, are close to each other. If a regular ground hole is spaced between the first signal via hole 5011 and the second signal via hole 5012, isolation effect is insufficient. Therefore, a "quincunx"-shaped primary ground hole 502 is used in this embodiment of this application, a diameter of a single primary ground hole 502 is increased by using a secondary hole other than a primary hole. From a perspective of signal via holes (a first signal via hole 5011 and a second signal via hole 5012) on two sides, the "quincunx"-shaped primary ground hole 502 increases an area of a return path, and larger-area shielding is implemented on direct electric field coupling of the signal via holes on the two sides of the primary ground hole 502. Therefore, the "quincunx"-shaped primary ground hole 502 significantly reduces crosstalk caused by the interfering pair to the interfered pair 1.

Then, in consideration of crosstalk of the interfering pair to an interfered pair 2, although most packages usually shift adjacent rows to reduce crosstalk between differential pairs in adjacent rows, this shift cannot ensure sufficient low package crosstalk effect in a high bandwidth when a rate is increased to 50 Gbps+. Therefore, a first secondary ground hole 503 is disposed in a position that is obtained after an upward shift from the middle of two signal via holes in a differential pair unit, and crosstalk caused by the interfering pair to the interfered pair 2 is effectively isolated by using the first secondary ground hole 503.

It should be noted that the "quincunx"-shaped primary ground hole 502 and the first secondary ground hole 503 do not only have the foregoing function of reducing crosstalk, but also have other functions. For example, the "quincunx"-shaped primary ground hole 502 may further improve backflow of a differential pair, and an electromagnetic field of the differential pair is constrained near the differential pair unit in most cases, thereby reducing a reference to a ground hole (the primary ground hole 502 or the first secondary ground hole 503) near another differential pair unit. Therefore, crosstalk between differential pair units of separated rows can also be reduced.

In this embodiment of this application, the "quincunx"-shaped primary ground hole 502 and the first secondary ground hole 503 need to be considered as a whole, and in a printed circuit board having a plurality of differential pair units, for example, "C"-shaped shielding structures formed by a plurality of groups of "quincunx"-shaped primary ground holes 502 and first secondary ground holes 503 shown in FIG. 8 separately surround a plurality of differential pair units, to ensure that when a signal is propagated along a direction (Z direction), of a hole, perpendicular to a disposing face of the printed circuit board, a good vertical shielding structure exists between the differential pair units to isolate crosstalk.

It may be learned from the foregoing description that, the "C"-shaped shielding structure provided in this application may have a function of shielding a differential pair unit, and mainly improve hole-hole coupling crosstalk. However, in the printed circuit board in this embodiment of this application, not only a hole-hole coupling part of crosstalk is considered, hole-trace coupling crosstalk and trace-trace coupling crosstalk can also be improved.

Figure 9:
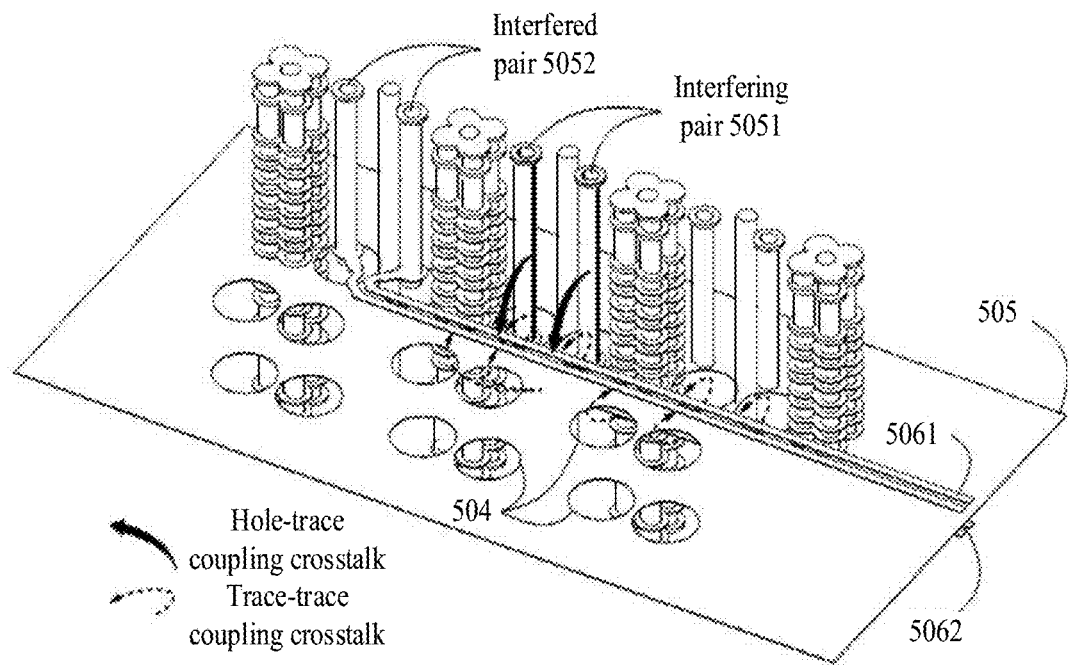
FIG. 9 is a schematic diagram of positions in which hole-trace coupling crosstalk and trace-trace coupling crosstalk occur according to an embodiment of this application.

FIG. 9 is a schematic diagram of positions in which hole-trace coupling crosstalk and trace-trace coupling crosstalk occur. For ease of displaying and describing crosstalk between a signal via hole and a trace, only via holes (signal via holes and ground holes) of rows in which an interfering pair 5051 and an interfered pair 5052 are located are shown, and via holes of other rows are hidden for ease of description. It should be understood that, in FIG. 9, only one interfering pair 5051 and one interfered pair 5052 are used as an example for description. When a plurality of differential pair units exist in the printed circuit board, a plurality of structures similar to those shown in FIG. 9 may exist. Hole-trace coupling crosstalk and trace-trace coupling crosstalk occur in any printed circuit board. When a signal rate is low, hole-trace coupling and trace-trace coupling are relatively small because an effective bandwidth is relatively low. However, after the rate is increased and a specification requirement of crosstalk is raised, functions of the hole-trace coupling and the trace-trace coupling cannot be ignored or even may be a key bottleneck.

When the interfering pair 5051 and the interfered pair 5052 are connected to a trace in the printed circuit board, a signal via hole in the interfering pair 5051 is connected to a trace 5062, and a signal via hole in the interfered pair 5052 is connected to a trace 5061. A ground layer 505 is spaced between the trace 5062 and the trace 5061. To be distinguished from another ground layer, the ground layer 505 is named as a first ground layer. The traces (5061 and 5062) of conductor layers on two sides of the first ground layer are located outside of an anti-pad 504 of the first ground layer.

The trace 5062 is laid out relatively close to the interfering pair 5051. A region with most severe coupling crosstalk is located at a cross-adjacent position of the two (the interfering pair 5051 and the trace 5062). A part of the interfering pair 5051 with strongest interference is a part, of the interfering pair 5051, that passes a position near a layer at which the trace 5061 is located. A part of the trace 5061 that is most severely interfered with is a part, of the trace 5061, that passes a position near the interfering pair 5051. The interfering pair 5051 that generates interference is perpendicular to the disposing face of the printed circuit board, and the trace 5061 that is interfered with is located in the printed circuit board and is parallel to the disposing face. Therefore, a transfer direction of interference is mainly three-dimensional. Therefore, it does not only require a shielding structure formed by a ground hole to adjust and improve hole-trace coupling crosstalk, but also requires a ground layer to isolate a component, of the interference, transmitted along a vertical direction.

A region obtained after the ground layer is hollowed out is usually an anti-pad 504 of a signal via hole. Therefore, effect of isolating interference by the ground layer depends on a size of the anti-pad 504. A larger size of the anti-pad 504 leads to a larger nonmetallic region on the ground layer, a higher possibility that a signal passes through the ground layer, and poorer effect of isolating interference by the ground layer. Otherwise, a smaller size of the anti-pad 504 leads to a smaller metal region on the ground layer, and better effect of isolating interference by the ground layer. However, in this embodiment of this application, for a signal via hole pair in a differential pair unit, a double anti-pad 504 is used, and ground layer parts between a pair of signal via holes are interconnected and communicate with each other without being broken such that a region in which a ground layer is hollowed out is minimized, and transfer of a component of interference transmitted in a vertical direction is suppressed to a maximum extent, thereby further improving suppression of hole-trace coupling crosstalk on the basis of isolation of a "C"-shaped shielding structure.

In trace-trace coupling crosstalk, it is considered that a trace that is interfered with is the trace 5061, an interfering trace is the trace 5062, and the two traces are not at the same layer but share a ground layer 505. Because an anti-pad 504 needs to be correspondingly disposed for a signal via hole on the ground layer, the ground layer 505 cannot be completely closed without any opening, and as a result, energy of the trace 5062 can be coupled to the trace 5061 of an adjacent layer through the anti-pad 504. Therefore, an area of an opening of the anti-pad 504 has great impact on trace-trace coupling. In this embodiment of this application, an anti-pad 504 is in a one-to-one correspondence with a signal via hole such that an opening of the anti-pad 504 is relatively small, and only a signal with a relatively short wavelength can pass through the anti-pad 504, and a signal with a relatively long wavelength cannot pass through the anti-pad 504. Therefore, more trace-trace coupling interference can be suppressed. From another perspective, a double anti-pad 504 retains connection between ground layer parts between a pair of signal via holes such that interference of the anti-pad 504 on signal backflow is less, and the trace 5061 and the trace 5062 do not generate relatively small coupling because a relatively large return path of each other has relatively strong mutual inductance.

It may be learned from the foregoing description that an interfering signal is propagated neither only along a direction perpendicular to the disposing face, nor only along a direction parallel to the disposing face. A propagation direction of the interfering signal is three-dimensional. Therefore, in the printed circuit board provided in this embodiment of this application, the double anti-pad 504 and the ground hole array do not separately affect interference in a vertical direction and interference in a horizontal direction. Instead, the double anti-pad 504 and the ground hole array form a three-dimensional overall shielding structure in a package region, to provide a nearby backflow reference in each direction for a signal in limited space, to suppress transfer of the interfering signal. In multi-layer space of the printed circuit board, the double anti-pad 504 optimizes division of the ground layer, and improves plane backflow, and the ground hole array improves backflow in a vertical direction. The ground hole array and the ground layer that uses the double anti-pad 504 divide space in the printed circuit board into small-sized grid units, and there is a good backflow reference for a signal to pass through each grid unit, thereby suppressing external transfer of interference.

Figure 10:
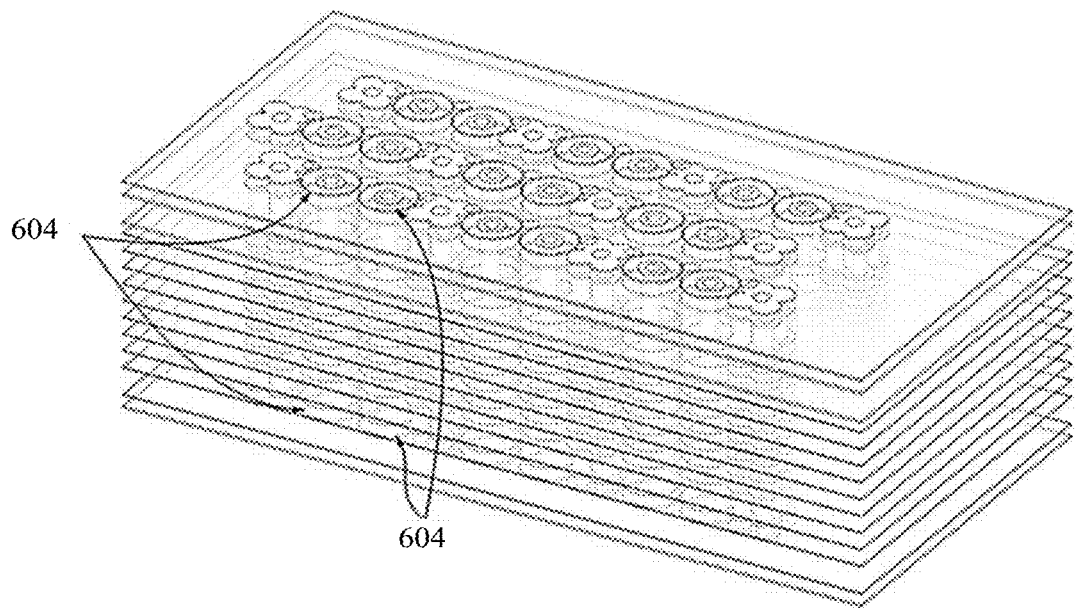
FIG. 10 is another schematic diagram of a printed circuit board according to an embodiment of this application.

FIG. 10 is another schematic diagram of a printed circuit board according to an embodiment of this application. The printed circuit board includes a plurality of differential pair units, each differential pair unit includes two signal via holes 601, and the signal via holes 601 pass through some layer structures of the printed circuit board along a Z direction.

Figure 11:
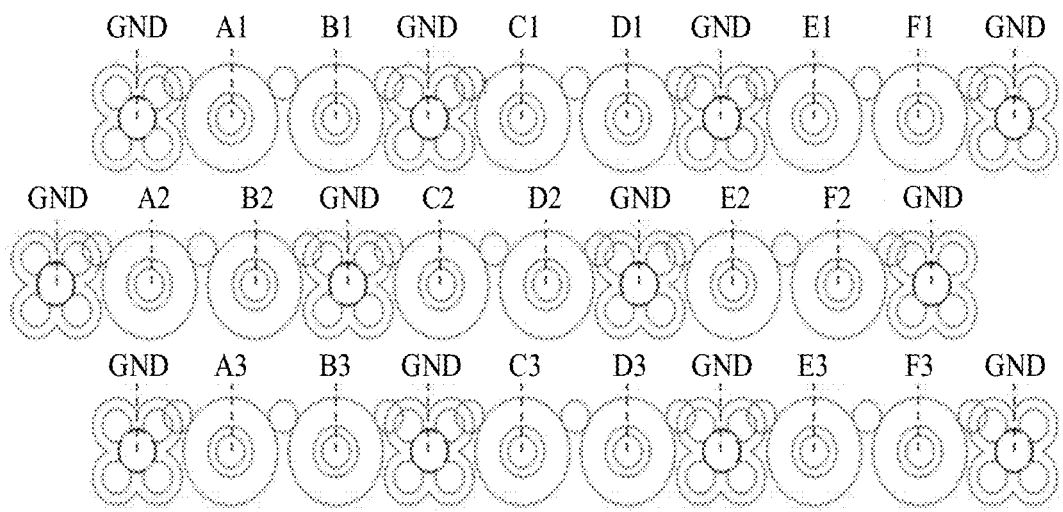
FIG. 11 is a schematic diagram of arrangement of differential pair units according to an embodiment of this application.

FIG. 11 is a schematic diagram of arrangement of differential pair units. A plurality of differential pair units are arranged in an array. The first row of differential pair units includes signal via holes A1, B1, C1, D1, E1, and F1, the second row of differential pair units includes signal via holes A2, B2, C2, D2, E2, and F2, and the third row of differential pair units includes signal via holes A3, B3, C3, D3, E3, and F3. It should be understood that, in FIG. 11, only the three rows of differential pair units are used as an example for description. In an actual printed circuit board, differential pair units of different quantities of rows may be disposed according to actual needs.

Figure 12:
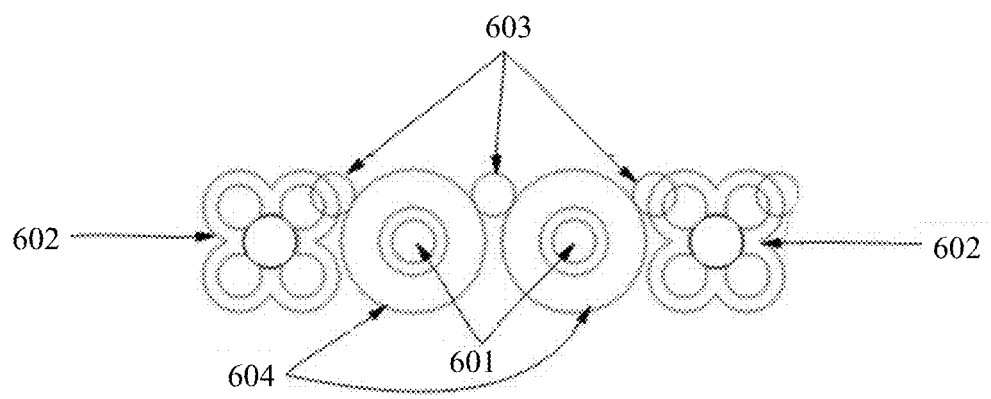
FIG. 12 shows a differential pair unit and a corresponding shielding structure according to an embodiment of this application.

Also, refer to FIG. 12. FIG. 12 shows a differential pair unit and a corresponding shielding structure. Each differential pair unit includes two signal via holes 601. A circular anti-pad 604 that is correspondingly disposed on each ground layer through which the signal via hole 601 passes. The shielding structure includes primary ground holes 602 and three secondary ground holes 603. The three secondary ground holes 603 are respectively a first secondary ground hole disposed between the two signal via holes 601 and second secondary ground holes disposed between the primary ground holes 602 and the signal via holes 601.

An arrangement direction of signal via holes 601 in a differential pair unit is a second direction (X direction), and a vertical direction of the signal via holes 601 is referred to as a first direction (Y direction), to be specific, the first direction is a direction that is parallel to a disposing face and that is perpendicular to the arrangement direction of the two signal via holes 601. There is one primary ground hole 602 on each of two sides of the signal via holes 601 along the second direction. The primary ground hole 602 includes a primary hole and four secondary holes. The secondary holes are distributed around the ground hole by using the primary hole as a center, and any secondary hole is electrically connected to the primary hole by using a metalized hole wall of the secondary hole or a ground plane connected to the secondary hole. It should be understood that, in some examples, a quantity of secondary holes of a single primary hole may be less than that in this embodiment, but the quantity of secondary holes should be not less than one. When the secondary holes are distributed, an overall width of the primary ground hole 602 in the first direction needs to be increased such that a width of each primary ground hole 602 in the first direction is greater than a width of each signal via hole 601 in the first direction, thereby improving shielding effect. In addition, when the primary ground holes 602 are disposed, a center point connection line of the two primary ground holes 602 overlaps a center point connection line of the two signal via holes 601, to facilitate arrangement of more rows of differential pair units.

When the secondary ground hole 603 is disposed, a center point of the secondary ground hole 603 is located on one side of the center point connection line of the two signal via holes 601 such that the secondary ground hole 603 cooperates with the primary ground hole 602 to form a C-shaped shielding structure. As shown in FIG. 12, the three secondary ground holes 603 are distributed on one side of the signal via hole 601, and form a C-shaped shielding structure with the primary ground hole 602. In some implementations, a quantity of secondary ground holes 603 may be less than a quantity of secondary ground holes in this embodiment, but is not less than one, and at least one secondary ground hole 603 is located between two signal via holes 601 in the differential pair unit, to form a "C"-shaped ground hole shielding array with a ground hole.

Refer to FIG. 11 and FIG. 12 together. Adjacent differential pair units arranged along the second direction share one primary ground hole 602, and a spacing between the differential pair units along the second direction may be 1.3 mm. With a center of a hole as a reference, three differential pair units may be arranged in one row within 10.8 mm. In this embodiment, a spacing between adjacent rows is 1.8 mm. To avoid strong crosstalk caused when signal via holes vertically and directly face each other in the first direction, the second row is shifted leftwards in the second direction relative to the first row. For example, a shifting distance may be 1 mm. In addition to improving crosstalk between differential pair units in different rows through row misplacement, crosstalk between differential pair units in adjacent rows is further reduced by disposing the secondary ground hole 603. Along the second direction, a plurality of secondary ground holes 603 and a plurality of primary ground holes 602 in different units form one row of ground hole array, to effectively shield inter-row crosstalk. It may be learned from the foregoing description that the secondary ground holes 603 and the primary ground hole 602 cooperate to form the "C"-shaped shielding structure for the differential pair unit, and a signal via hole is opened only on a side along the first direction to facilitate trace routing.

In this embodiment, a side wall of the signal via hole 601 is electroplated with metal to form a conductive layer to transfer a signal. In some implementations, a metal layer of the signal via hole 601 may cover a thickness of the entire printed circuit board, or may not cover the thickness of the entire printed circuit board in a form of a blind hole or backdrilling process. A direction perpendicular to the thickness of the printed circuit board is referred to as a third direction (Z direction), and is perpendicular to a plane in which the second direction and the first direction are located. For the primary ground hole 602 and the secondary ground hole 603, a length of a metal layer on a side wall of the primary ground hole 602 and the secondary ground hole 603 in the first direction needs to be not less than a length of the signal via hole 601 in the first direction. Metal on a side wall of a via hole includes but is not limited to a conductive metal material such as copper, aluminum, and silver, and a processing process of the metal includes but is not limited to electroplating, evaporation, sputtering, electroless plating, or vapor deposition.

A ground layer used as a signal reference is disposed inside the printed circuit board. For a differential pair unit, an anti-pad 604 corresponding to each signal via hole in the differential pair unit is applied to each ground layer through which the differential pair unit passes, that is, a double anti-pad 604 is used to correspond to a signal via hole 601 in the differential pair unit. The double anti-pad 604 not only implements a conventional function of bypassing a reference signal and controlling impedance of a via hole by the ground layer, but also retains interconnection of the ground layer between signal via holes such that a single anti-pad 604 has a relatively small opening on the ground layer, and forms a three-dimensional crisscross ground interconnection grid with the foregoing ground hole shielding array, and suppression effect on hole-hole coupling crosstalk, hole-trace coupling crosstalk, and trace-trace coupling crosstalk is improved. In some other implementations, a shape of the anti-pad includes but is not limited to a circle, a rectangle, a square, an oval, and the like, but it needs to be ensured that the double anti-pad can retain the interconnection of the ground layer between the signal via holes.

In this embodiment, a primary hole of the primary ground hole 602 is a pressfit via hole, and secondary holes are distributed around the primary hole. Because the secondary holes do not need to accommodate a pin of a connector, a hole diameter of the secondary holes may be made smaller, and usually, a via hole pad of the secondary holes is made relatively small.

Figure 13:
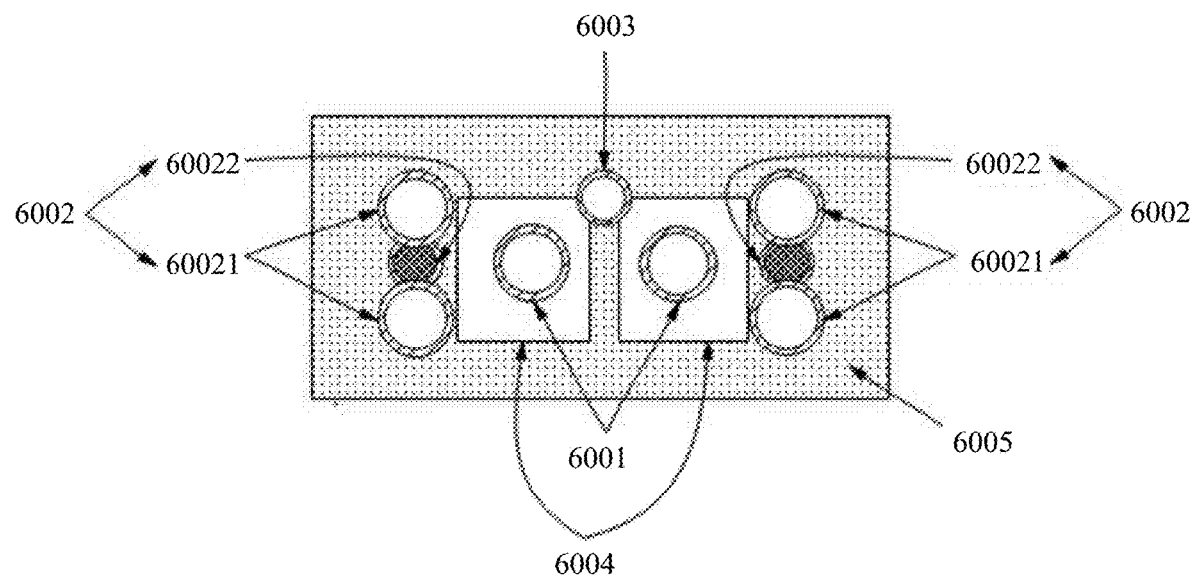
FIG. 13 is a schematic diagram of another shielding structure according to an embodiment of this application.

FIG. 13 is a schematic diagram of another shielding structure according to an embodiment of this application. A via hole on a printed circuit board includes a signal via hole 6001, a primary ground hole 6002, and a secondary ground hole 6003. The primary ground hole 6002 is a primary-secondary ground hole including two primary holes 60021 and one secondary hole 60022. The secondary hole 60022 is located between the two primary holes 60021, and separately communicates with and is electrically connected to the primary holes 60021. For example, the secondary hole 60022 is located between the two primary holes 60021, and the three holes are arranged in a first direction, or arranged in a direction inclined relative to the first direction.

The two primary holes 60021 are connected to a ground pin of a connector, and the secondary hole 60022 is not directly connected to a pin of the connector, and is connected to the two primary holes 60021 by using side wall metal in the secondary hole 60022 such that a width of the entire primary-secondary ground hole 6002 in the first direction is significantly greater than a width of the signal via hole 6001 in the first direction, thereby improving isolation between different differential pair units in the same row in the first direction. In addition, the secondary ground hole is in the first direction of centers of the two via holes 6001 in the differential pair unit, to form a "C"-shaped ground hole shielding array with the primary ground hole 6002. In particular, to cooperate with the "C"-shaped ground hole shielding array, a double anti-pad 6004 needs to be disposed on a reference ground plane 6005 through which the signal via hole 6001 passes. In FIG. 13, the anti-pad 6004 is in a shape of a rectangle.

To facilitate understanding of effect of the printed circuit board provided in this embodiment of this application on signal crosstalk, full-wave simulation is performed on the printed circuit board provided in this embodiment of this application and the printed circuit board in the conventional technology. For a simulation result, refer to Table 1. In Table 1, C2D2 in FIG. 10 is used as an interfering pair, and comprehensive crosstalk when eight differential pairs around the interfering pair simultaneously cause near-end crosstalk or far-end crosstalk is separately considered.

TABLE 1

| Solution | Item | | | |
|---|---|---|---|---|
| | Multi-disturber near-end crosstalk (MDNEXT) | | Multi-disturber far-end crosstalk (MDFEXT) | |
| Frequency bandwidth | 14 GHz | 28 GHz | 14 GHz | 28 GHz |
| Conventional solution | −43.1 dB | −31.4 dB | −36.0 dB | −20.2 dB |
| This embodiment | −52.4 dB | −43.4 dB | −44.4 dB | −37.5 dB |
| Gains compared with the conventional solution | 9.3 dB | 12 dB | 8.4 dB | 17.3 dB |

It may be learned from Table 1 that, compared with an existing conventional printed circuit board, the printed circuit board provided in this embodiment has lower effect of coupling crosstalk between holes. In addition, the double anti-pad used in this embodiment suppresses, to a maximum extent, degradation of hole-trace coupling and trace-trace coupling caused by layer shifting.

During preparation of the printed circuit board, when the anti-pad deviates from a second direction by 7 mil due to deviation during preparation of each layer, compared with that of a conventional single anti-pad hollowing-out design, a hole-trace coupling suppression gain obtained after a circular double anti-pad cooperates with the "C"-shaped shielding ground hole array reaches MDNEXT gains of 3.6 dB@14 GHz and 4.1 dB@28 GHz, and MDFEXT gains of 3.6 dB@14 GHz and 4.8 dB@28 GHz.

When the layer shifting causes the anti-pad to deviate by 7 mil in the second direction, compared with the conventional single-circle anti-pad hollowing-out design, a trace-trace coupling suppression gain obtained after a circular double anti-pad cooperates with the "C"-shaped shielding ground hole array reaches MDNEXT gains of 4.2 dB@14 GHz and 6.1 dB@28 GHz, and MDFEXT gains of 6.6 dB@14 GHz and 6.2 dB@28 GHz.

Figure 14:
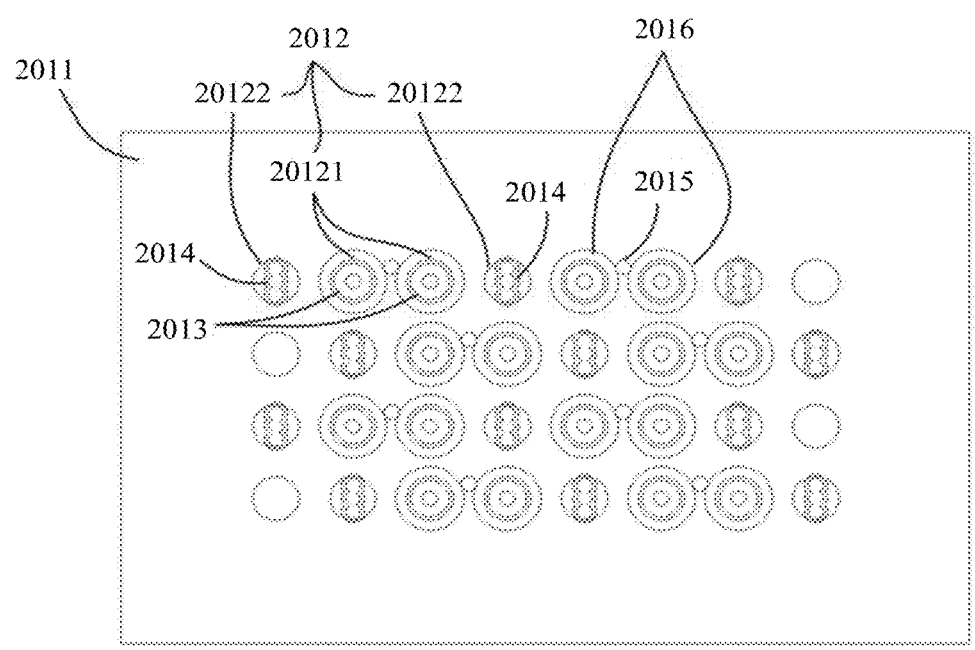
FIG. 14 is a schematic diagram of arrangement of via holes and ground holes of a printed circuit board that cooperates with a chip.
Figure 15:
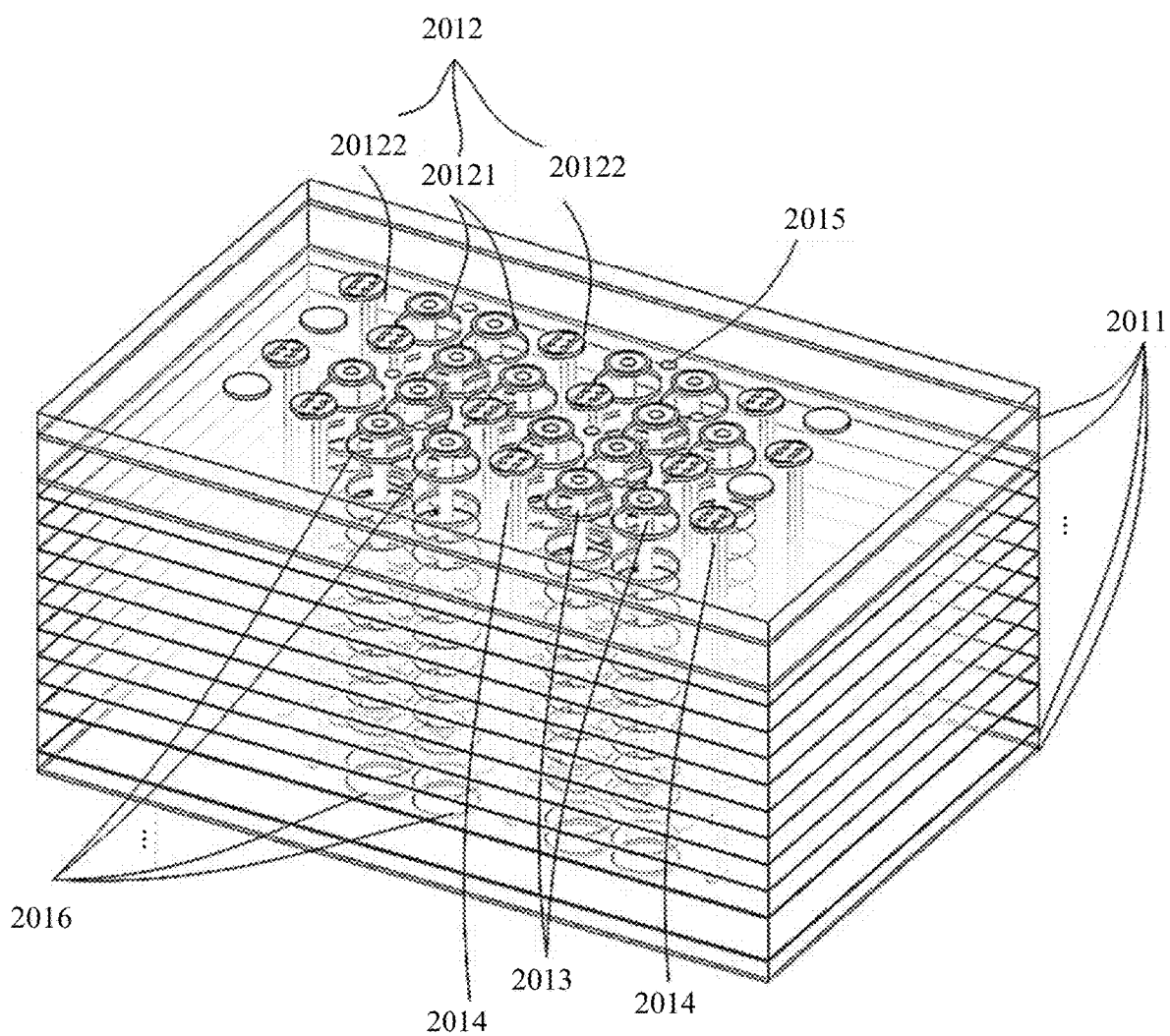
FIG. 15 is a three-dimensional schematic diagram of the printed circuit board shown in FIG. 14.

FIG. 14 is a schematic diagram of arrangement of via holes and ground holes of a printed circuit board that cooperates with a chip. FIG. 15 is a schematic diagram of a three-dimensional structure corresponding to FIG. 14.

A part of the printed circuit board corresponds to pads of all pins of a chip and via hole regions corresponding to the pads, and the printed circuit board has a plurality of groups of differential pair units. As shown in FIG. 14, chip pads 2012 in this embodiment are distributed in a 4×8 equal-spaced matrix manner by row and column. In some other implementations, the chip pads may be periodically distributed in an equal-spaced or unequal-spaced manner according to a specific rule. In the 4×8 chip pads 2012, eight pairs of differential pair units may be arranged in high density, and signal integrity is also good. According to different allocated signal network attributes, the chip pads 2012 are divided into a signal pad 20121 and a ground pad 20122 that respectively correspond to a signal pin and a ground pin of the chip. For ease of description, a straight line along which a pair of signal pads 20121 is located indicates a first direction, and a direction perpendicular to the first direction along a plane of the printed circuit board is a second direction.

Along the first direction, two adjacent signal pads 20121 are a group of differential pair units, and there is a ground pad 20122 on each of two sides of the signal pads 20121. One ground pad 20122 is spaced between two adjacent groups of differential pair units. Along the second direction, two groups of closest differential pair units are staggered by a length of a chip pad spacing in the first direction, to avoid relatively large crosstalk caused when two groups of differential pair units in adjacent rows directly face each other.

Although the foregoing arrangement has reduced the crosstalk as much as possible by using a method of isolating the ground pad and staggering the differential pair units in the adjacent rows, in compact space, there is still relatively obvious package crosstalk between signal pads and traces that limits link performance.

To route a signal on the chip pad to traces of different layers of the printed circuit board, a signal via hole 2013 is disposed between the signal pads 20121, and a diameter of the via hole 2013 is 8 mil. This is usually completed by using a via-in-pad process. To isolate crosstalk between signal via holes 2013 in different differential pair units and also provide a ground return path for a signal transmitted through the signal via hole 2013, a primary ground via hole 2014 is disposed between the ground pads 20122. The primary ground via hole 2014 includes three ground via holes distributed in a second direction, a diameter of each of the via holes is 8 mil, and a center distance between via holes in the second direction is 7 mil. A via hole located on the ground pad 20122 is a primary hole, via holes on two sides distributed along the second direction are secondary holes, and hole wall metal of each of the two secondary holes is electrically connected to hole wall metal of the primary hole such that a length of the primary ground via hole 2014 formed by the three via holes in the second direction is greater than a length of the signal via hole 2013 in the second direction, to effectively isolate crosstalk between adjacent differential pair units along the first direction.

In addition, between two signal pads 20121 in any differential pair unit, a secondary ground hole 2015 is disposed in a position 7 mil upward along the second direction, and a drill hole diameter of the secondary ground hole 2015 is 8 mil. The secondary ground hole 2015 can effectively reduce crosstalk between differential pair units in adjacent rows. In a pair of differential pair units, a secondary ground hole 2015 cooperates with primary ground via holes 2014 on two sides to form a "C"-shaped ground hole shielding structure. From a perspective of an entire package, a plurality of such combinations form a "C"-shaped ground hole shielding array in the package, thereby effectively reducing hole-hole coupling crosstalk.

In this embodiment, no reference ground layer is disposed at the top layer at which the chip pad 2012 is located, but a plurality of ground layers 2011 are disposed at an internal layer of the printed circuit board according to design requirements. To bypass the signal via hole 2013, on the ground layer 2011 through which the signal via hole 2013 passes, the ground layer 2011 is hollowed out by using the signal via hole as a center, to form an anti-pad 2016, and the anti-pad 2016 is in a shape of a circle in this embodiment. It should be understood that, the primary ground via holes 2014 and the secondary ground hole 2015 all need to be connected to the reference ground layer 2011. The double anti-pad 2016 can effectively improve trace-trace coupling crosstalk and hole-trace coupling crosstalk in the package region by cooperating with the "C"-shaped ground hole shielding array.

An embodiment of this application further provides a backplane architecture system. The backplane architecture system includes a backplane and a connector connected to the backplane. For a specific connection manner, refer to a connection manner in FIG. 1. The backplane is the printed circuit board according to any one of the foregoing specific implementable solutions. In the foregoing technical solution, each signal corresponds to one anti-pad, and a ground layer is spaced between anti-pads, thereby reducing interference, to a trace, of a signal of a signal via hole or a trace of an adjacent layer after passing through an anti-pad, and resolving a crosstalk problem in the printed circuit board. In addition, primary ground holes and a first secondary ground hole form a shielding structure, to reduce crosstalk between a differential pair unit and another differential pair unit, and resolve a crosstalk problem of the printed circuit board, thereby facilitating dense arrangement of sockets on the printed circuit board.

An embodiment of this application further provides a communication device. The communication device may be a communication apparatus such as a base station or a cabinet in an equipment room. The communication device includes a cabinet and the printed circuit board according to any one of the foregoing specific implementable solutions. The printed circuit board is inserted into the cabinet. In the foregoing technical solution, each signal corresponds to one anti-pad, and a ground layer is spaced between anti-pads, thereby reducing interference, to a trace, of a signal of a signal via hole or a trace of an adjacent layer after passing through an anti-pad, and resolving a crosstalk problem in the printed circuit board. In addition, primary ground holes and a first secondary ground hole form a shielding structure, to reduce crosstalk between a differential pair unit and another differential pair unit, and resolve a crosstalk problem of the printed circuit board, thereby facilitating dense arrangement of sockets on the printed circuit board.

It is clearly that a person skilled in the art can make various modifications and variations to this application without departing from the spirit and scope of this application. This application is intended to cover these modifications and variations of this application provided that they fall within the scope of protection defined by the following claims and their equivalent technologies.

What is claimed is:

1. A printed circuit board, comprising:
   a plurality of layer structures disposed in a stacked manner and comprising ground layers and conductor layers that are alternately arranged, wherein an outermost layer structure of the layer structures comprises a disposing face;
   a differential pair unit disposed on the disposing face and comprising:
      signal via holes, wherein each of the signal via holes passes through at least some of the ground layers and the conductor layers and is connected to a first trace at a first conductor layer of the conductor layers; and
      anti-pads respectively corresponding to the signal via holes, disposed on a first ground layer through which the signal via holes pass, and arranged at intervals; and
   a shielding structure configured to shield the differential pair unit, disposed on the disposing face, and comprising:
      primary ground holes located on sides of the differential pair unit; and
      a first secondary ground hole disposed on the disposing face and located between the signal via holes,
      wherein the primary ground holes and the first secondary ground hole separately pass through at least some of the conductor layers and the ground layers,
      wherein the primary ground holes and the first secondary ground hole are separately grounded to a second ground layer through which the primary ground holes and the first secondary ground hole pass,
      wherein the primary ground holes and the first secondary ground hole are arranged in a vertical direction to form a ground hole array, and
      wherein the ground hole array and the anti-pads are combined to form a small-sized grid in three-dimensional space in a package region of the printed circuit board.

2. The printed circuit board of claim 1, wherein a second trace of the conductor layers on sides of a third ground layer is located outside of second anti-pads of the third ground layer, and wherein each signal via hole passes through the third ground layer.

3. The printed circuit board of claim 1, wherein adjacent differential pair units in a plurality of differential pair units share a primary ground hole.

4. The printed circuit board of claim 3, wherein a first width of each primary ground hole in a first direction is greater than a second width of the signal via holes in the first direction, and wherein the first direction is parallel to the disposing face and perpendicular to an arrangement direction of the signal via holes.

5. The printed circuit board of claim 4, wherein each of the primary ground holes comprises a primary hole and at least one secondary hole that surrounds the primary hole, and wherein the primary hole communicates with each secondary hole and is electrically connected to each secondary hole.

6. The printed circuit board of claim 4, wherein each primary ground hole comprises two primary holes and a secondary hole located between the two primary holes, and wherein the secondary hole separately communicates with the two primary holes and is electrically connected to the two primary holes.

7. The printed circuit board of claim 1, wherein the primary ground holes and the first secondary ground hole form a C-shaped shielding structure that wraps the differential pair unit.

8. The printed circuit board of claim 7, wherein when each of the primary ground holes comprises a primary hole and at least one secondary hole that surrounds the primary hole, a first center point connection line of the primary ground holes overlaps a second center point connection line of the signal via holes.

9. The printed circuit board of claim 8, wherein a third center point of the first secondary ground hole is located on one side of the second center point connection line.

10. The printed circuit board of claim 8, wherein the shielding structure further comprises two of the first secondary ground hole with center points respectively located on sides of the second center point connection line.

11. The printed circuit board of claim 7, wherein the shielding structure further comprises a second secondary ground hole disposed between a first primary ground hole of the primary ground holes and an adjacent signal of the signal via holes.

12. A communication device, comprising:
   a cabinet; and
   a printed circuit board inserted into the cabinet and comprising:
      a plurality of layer structures disposed in a stacked manner and comprising ground layers and conductor layers that are alternately arranged, wherein an outermost layer structure of the layer structures comprises a disposing face;

a differential pair unit disposed on the disposing face and comprising:
  signal via holes, wherein each of the signal via holes passes through at least some of the ground layers and the conductor layers, and is connected to a first trace at a first conductor layer of the conductor layers; and
  anti-pads respectively corresponding to the signal via holes, disposed on a first ground layer through which the signal via holes pass, and arranged at intervals; and
a shielding structure configured to shield the differential pair unit, disposed on the disposing face, and comprising:
  primary ground holes located on sides of the differential pair unit; and
  a first secondary ground hole disposed on the disposing face and located between the signal via holes,
  wherein the primary ground holes and the first secondary ground hole separately pass through at least some of the conductor layers and the ground layers,
  wherein the primary ground holes and the first secondary ground hole are separately grounded to a second ground layer through which the primary ground holes and the first secondary ground hole pass,
  wherein the primary ground holes and the first secondary ground hole are arranged in a vertical direction to form a ground hole array, and
  wherein the ground hole array and the anti-pads are combined to form a small-sized grid in three-dimensional space in a package region of the printed circuit board.

13. The communication device of claim 12, wherein a second trace of the conductor layers on sides of a third ground layer is located outside of second anti-pads of the third ground layer, and wherein each of the signal via hole pass through the third ground layer.

14. The communication device of claim 12, wherein adjacent differential pair units in a plurality of differential pair units share a primary ground hole in the printed circuit board.

15. The communication device of claim 14, wherein a first width of each primary ground hole in a first direction is greater than a second width of the signal via holes in the first direction in the printed circuit board, and wherein the first direction is parallel to the disposing face and perpendicular to an arrangement direction of the signal via holes.

16. The communication device of claim 15, wherein each of the primary ground holes comprises a primary hole and at least one secondary hole that surrounds the primary hole, and wherein the primary hole communicates with each secondary hole and is electrically connected to each secondary hole.

17. The communication device of claim 15, wherein each primary ground hole comprises two primary holes and a secondary hole located between the two primary holes, and wherein the secondary hole separately communicates with the two primary holes and is electrically connected to the two primary holes.

18. The communication device of claim 12, wherein the primary ground holes and the first secondary ground hole form a C-shaped shielding structure that wraps the differential pair unit.

19. The communication device of claim 18, wherein when each of the primary ground holes comprises a primary hole and at least one secondary hole that surrounds the primary hole, a first center point connection line of the primary ground holes overlaps a second center point connection line of the signal via holes.

20. The communication device of claim 19, wherein a third center point of the first secondary ground hole is located on one side of the second center point connection line.

* * * * *